United States Patent
Delp et al.

(10) Patent No.: US 6,601,200 B1
(45) Date of Patent: Jul. 29, 2003

(54) INTEGRATED CIRCUIT WITH A VLSI CHIP CONTROL AND MONITOR INTERFACE, AND APPARATUS AND METHOD FOR PERFORMING OPERATIONS ON AN INTEGRATED CIRCUIT USING THE SAME

(75) Inventors: Gary Scott Delp, Rochester, MN (US); Antonius Paulus Engbersen, Feusisberg (CH); Andreas G. Herkersdorf, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/449,081

(22) Filed: Nov. 24, 1999

(51) Int. Cl.[7] .......................... G01R 31/28; H02H 3/05
(52) U.S. Cl. ........................ 714/724; 714/4; 714/46
(58) Field of Search ............................ 714/724, 733, 714/734, 742, 4, 3, 30, 31, 44, 46, 47, 57; 709/223, 224, 230, 229

(56) References Cited

U.S. PATENT DOCUMENTS 5,321,277 A * 6/1994 Sparks et al. ............. 257/390
6,425,101 B1 * 7/2002 Garreau .................... 714/727
6,449,741 B1 * 9/2002 Organ et al. ............... 714/46

* cited by examiner

Primary Examiner—Christine T. Tu
(74) Attorney, Agent, or Firm—Martin & Associates L.L.C.; Derek P. Martin (57) ABSTRACT

An integrated circuit (i.e., chip under test) includes a control and monitor interface that includes on-chip support for one or more network protocols that allow the chip to be directly coupled to a network. The control and monitor interface defines one or more operations that can be performed on the chip. In a system for testing chips under test, the control and monitor interface of all of the chips under test are coupled to a network, which is also coupled to a control and monitor mechanism. When a chip under test receives a message on the network from the control and monitor mechanism to execute an operation, it performs the requested operation, then reports the results. In this manner much of the intelligence regarding the test can be pushed on-chip, rather than having all of the testing intelligence residing in an external tester. This allows some standardization in tests that are performed from one chip under test to the next.

22 Claims, 10 Drawing Sheets

FIG. 13

INTEGRATED CIRCUIT WITH A VLSI CHIP CONTROL AND MONITOR INTERFACE, AND APPARATUS AND METHOD FOR PERFORMING OPERATIONS ON AN INTEGRATED CIRCUIT USING THE SAME

BACKGROUND OF THE INVENTION

1. Technical Field

This invention generally relates to electronic testing, monitoring, and control, and more specifically relates to integrated circuit testing, monitoring, and control.

2. Background Art

The proliferation of modern electronics into our everyday life is due in large part to the existence, functionality and relatively low cost of advanced integrated circuits. As technology moves ahead, the sophistication of electronic systems increases. An important aspect of manufacturing an advanced electronic system is the ability to thoroughly test the components and subassemblies in the system. The testability of semiconductors was enhanced with the development of boundary-scan testing, as disclosed in IEEE Standard 1149.1 "Standard Test Access Port and Boundary Scan Architecture." Boundary scan testing allows an integrated circuit to be tested by placing shift registers between functional circuitry and input/output pins when the device is placed in test mode. Test data is typically serially scanned into the shift registers to drive certain inputs, clocks are applied, results are captured, and the resultant outputs are determined by shifting the data out of the registers. The serial shift register elements that make up the boundary scan circuitry is known as a scan chain, because test data may be shifted or "scanned" into or out of the daisy-chained boundary scan registers.

Boundary scan testing requires an external tester that has detailed knowledge regarding the configuration of chips in the scan chain, the test data to be shifted into the scan chain, and the expected results that should be shifted out of the scan chain. As a result, as each new chip and electronic assembly is developed, the test procedure for each chip and for each electronic assembly must be manually derived and programmed into the external tester. Boundary scan testing thus-requires a new custom test-to be defined in the tester for each new chip or assembly that is developed, along with a specific test fixture for each chip and electronic assembly.

Boundary scan testing is beneficial for testing interconnections on an electronic assembly and for static testing of the defined data structures of an integrated circuit. However, boundary scan testing does not support dynamic or "in operation" testing, monitoring, or control of an integrated circuit or electronic assembly. Without a way to test a new chip or electronic assembly without manually defining each new test in an external tester, the effort required to test an integrated circuit or electronic assembly will continue to be a drain on the resources of companies that develop chips and electronic assemblies.

DISCLOSURE OF INVENTION

According to the preferred embodiments, an integrated circuit (i.e., chip under test) includes a control and monitor interface that includes on-chip support for one or more network protocols that allow the chip to be directly coupled to a network. The control and monitor interface defines one or more operations that can be performed on the chip. In a system for testing chips under test, the control and monitor interface of all of the chips under test are coupled to a network, which is also coupled to a control and monitor mechanism. When a chip under test receives a message on the network from the control and monitor mechanism to execute an operation, it performs the requested operation, then reports the results. In this manner much of the intelligence regarding the test can be pushed on-chip, rather than having all of the testing intelligence residing in an external tester. This allows some standardization in tests that are performed from one chip under test to the next.

The foregoing and other features and advantages of the invention will be apparent from the following more particular description of preferred embodiments of the invention, as illustrated in the accompanying drawings.

BRIEF DESCRIPTION OF DRAWINGS

The preferred embodiments of the present invention will hereinafter be described in conjunction with the appended drawings, where like designations denote like elements, and.

BEST MODE FOR CARRYING OUT THE INVENTION

Overview

Understanding the present invention requires a basic knowledge of boundary scan testing techniques and known networking techniques, discussed below. Those who are familiar with these concepts may prefer to proceed with the Detailed Description section.

Boundary Scan Testing

Figure 1:
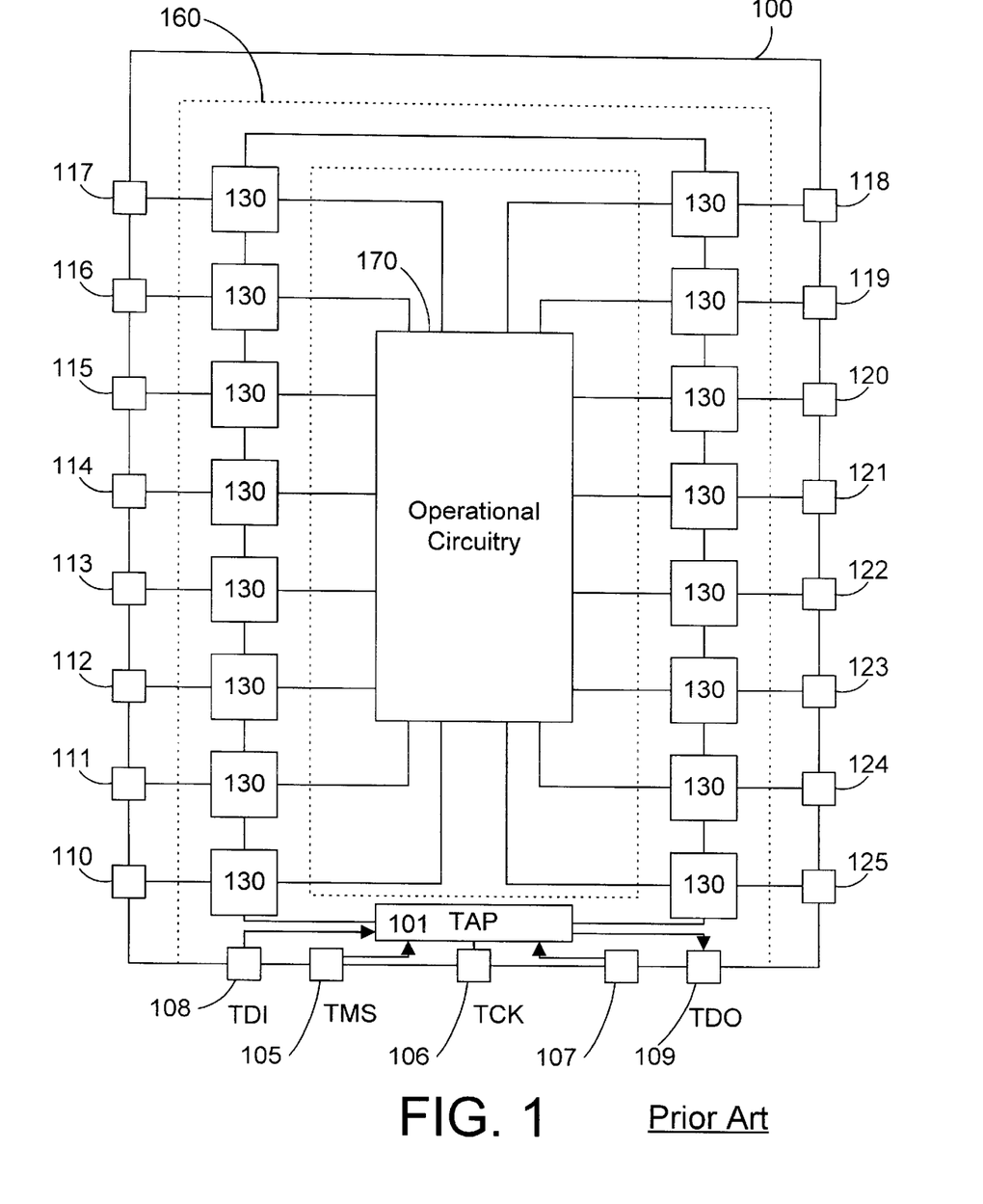
FIG. 1 is a block diagram of a prior art chip that includes hardware that supports boundary scan testing.

As discussed in the Background section, boundary-scan testing, as disclosed in IEEE Standard 1149.1, allows an integrated circuit to be tested by placing shift registers between functional circuitry and input/output pins when the device is placed in test mode. Referring to FIG. 1, an integrated circuit 100 that has boundary scan circuitry includes operational circuitry 170, a plurality of input/output pins such as 105–125, a test access port 101, and a plurality of boundary scan cells 130. Operational circuitry 170 is the circuitry that is active during normal operation of device 100. In a normal mode of operation, operational circuitry 170 is coupled to input/output pins 110–125. Only in test mode do boundary scan cells 130 become active.

The serial chain of boundary scan cells 130 is known as a scan chain 160, because test data may be shifted or "scanned" into or out of the daisy-chained boundary scan registers 130. Some input/output pins such as 105–107 provide needed control inputs into the circuitry of scan chain 160, such as shift clock signals to load and empty the scan chain. In the 1149.1 standard, an on-chip controller known as a test access port controller 101 provides the control signals to the boundary scan registers. In test mode, boundary scan cells 130 interrupt the signals to and from operational circuitry 170 that normally pass through to input/output pins 110–125. Boundary scan cells 130 typically include shift registers that allow test data to be shifted into the test data in input (pin 108), and that allow test results to be shifted out on the test data out output (pin 109). Test data is typically serially scanned into the test data in input (pin 108) of scan chain 160 to cause certain boundary scan cells to drive their respective pins. Clocks are then applied, results are captured, and the results are determined by shifting the data out of scan chain 160 at the test data out output (pin 109).

Figure 2:
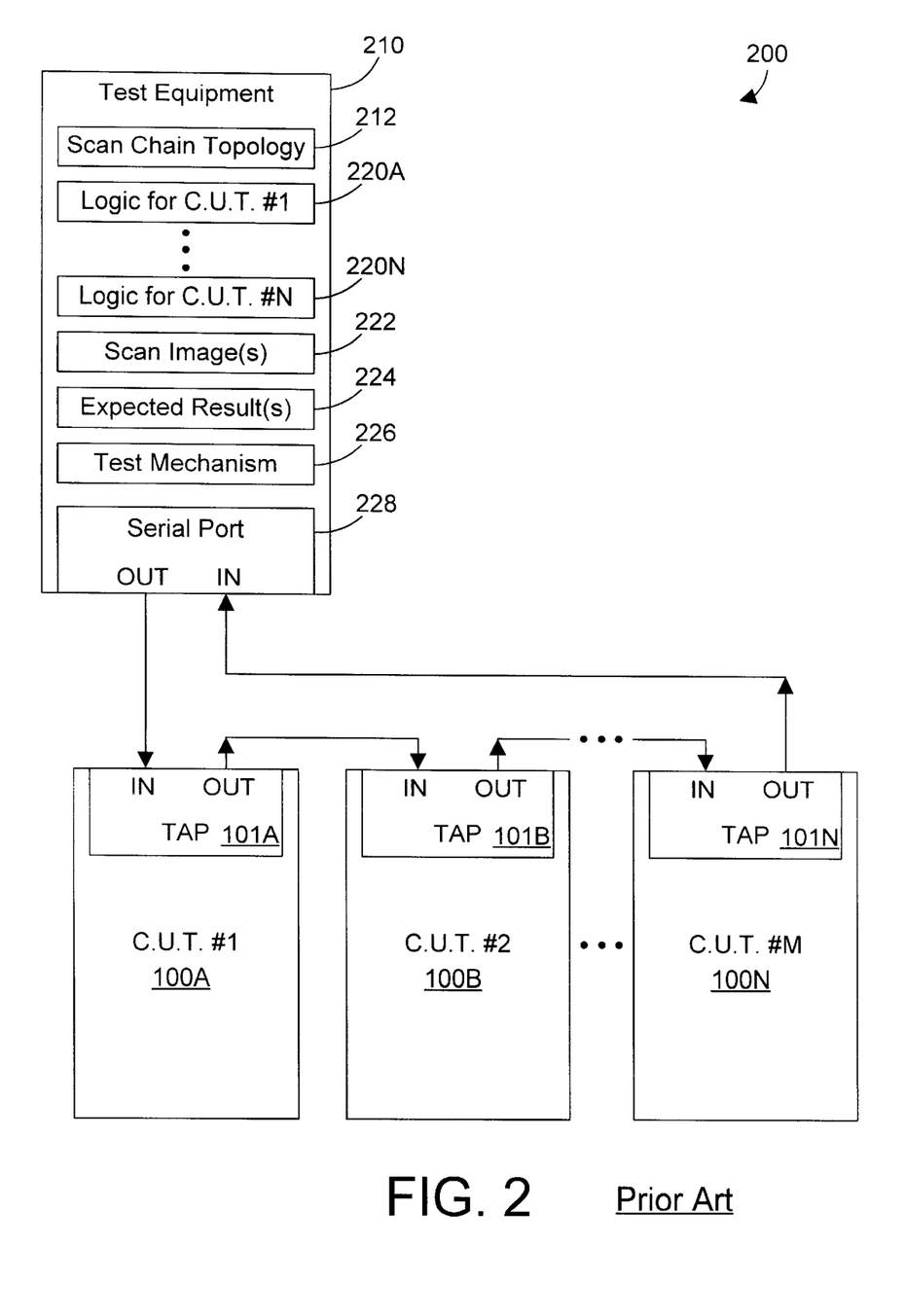
FIG. 2 is a block diagram showing a prior art system for testing multiple chips under test on an electronic assembly using boundary scan testing.

A system 200 for testing integrated circuits using boundary scan testing is shown in FIG. 2. The chips under test 10A, 100B, . . . 100N have their TAP ports 101 daisy-chained together to create a scan chain by connecting the serial output of one chip under test to the serial input of the next chip under test, and so on. An external piece of test equipment 210 provides all the intelligence for testing each chip under test, abbreviated in the figures as "C.U.T.". A test engineer typically programs the scan chain topology 212 into the test equipment 210. The scan chain topology is a description of which chips are interconnected in which sequence in the scan chain. In addition, the test engineer must enter the logic 220 for each chip under test. This logic is a description of the I/O pins and their function that allow functional testing of the chip using boundary scan testing. With the scan chain topology 212 defined and the logic for each individual chip 220 defined, the test engineer can now construct one or more scan images 222 that will be shifted into the scan chain during testing. The test engineer must also define the expected results 224 after shifting in a scan image and performing a test. Thus, there is typically one set of expected results for each defined scan image. A serial port 228 is provided for shifting data out of and into test equipment 210. Test equipment 210 also includes a test mechanism 226 that shifts out a scan image 222 via serial port 228 to the scan chain, initiates a test, and shifts in expected results 224 from the scan chain via the serial port 228.

Figure 3:
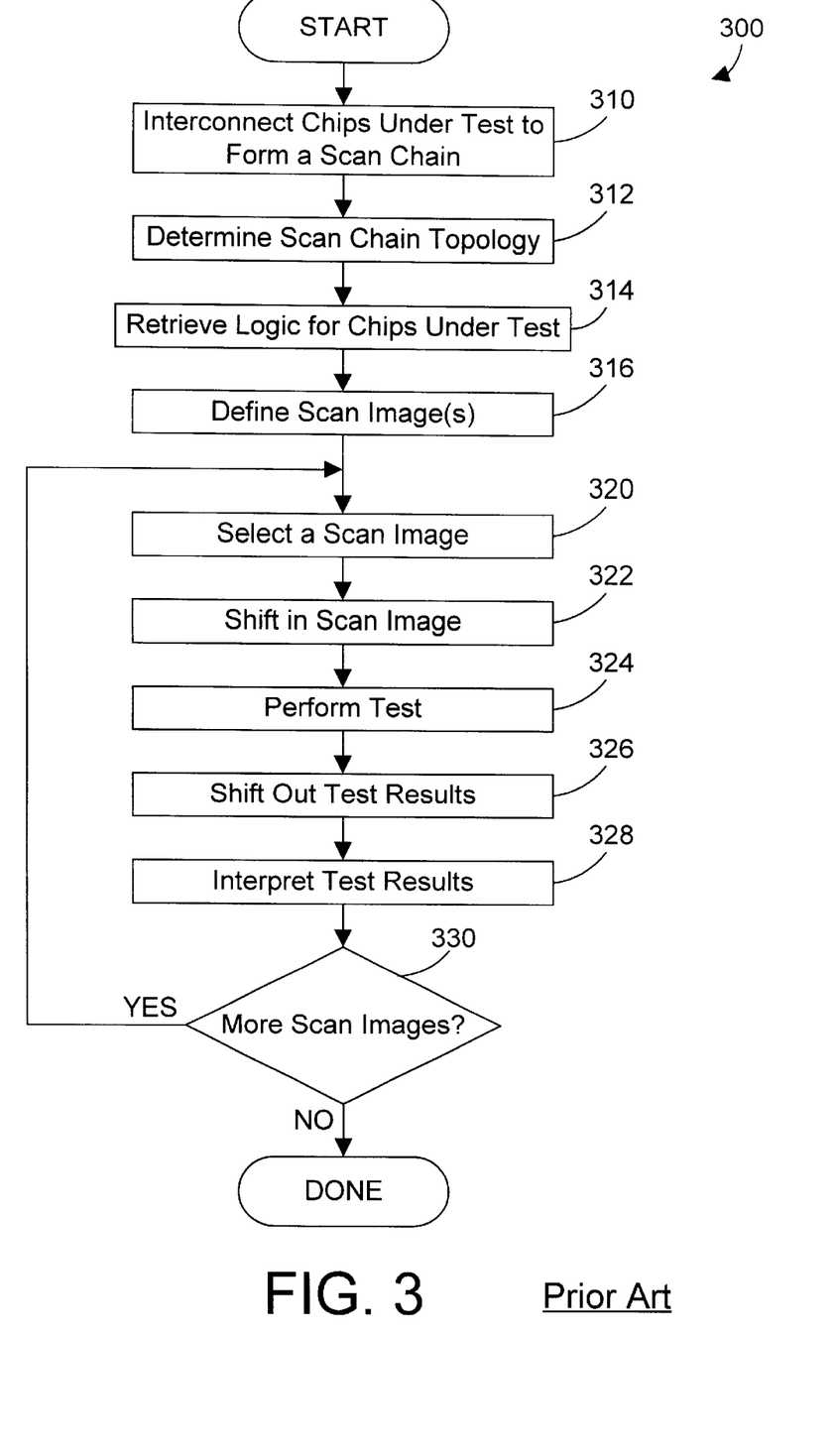
FIG. 3 is a flow diagram of a prior art method for testing the chips under test in FIG. 1.

Referring to FIG. 3, a method 300 for performing boundary scan testing of the chips under test in FIG. 2 begins by interconnecting the chips under test to form a scan chain (step 310). Next, the scan chain topology must be determined (step 312). Determining the scan chain topology is typically a manual process for a test engineer to evaluate the chips in the scan chain to determine the type and order of these chips in the scan chain. Next, the logic for the chips in the scan chain is retrieved (or generated, if not previously defined) (step 314). The logic for each chip in the scan chain includes a specification of the boundary scan registers and the tests that can be performed for each chip. Finally, with the information from steps 312 and 314, the test engineer can construct one or more scan images (step 316). Each scan image has a length of the number of boundary scan registers in the scan chain so that when the scan image is shifted into the scan chain, each register has a new value shifted in from the test equipment. Once the scan images are defined, one of the scan images is selected (step 320) and shifted into the scan chain (step 322). The test is then performed by providing suitable clock or other control signals to the chips under test (step 324), and the results are then shifted out of the scan chain (step 326). Once the tester has the results that were shifted out of the scan chain, it can interpret the results (step 328) to determine if they match the expected results of the test. If there are more scan images to shift into the scan chain (step 330=YES), steps 320–328 are repeated again for each scan image. When all the scan images have been shifted into the scan chain (step 330=NO), method 300 is done.

As mentioned in the Background section, and as shown in FIG. 2, boundary scan testing requires that test equipment 210 contain all the intelligence for testing the chips under test. This means that when a new chip is developed, a test engineer must define the scan chain topology 212, must create the logic 220 for the chip under test, must define one or more scan images 222, and must define corresponding expected results 224. Defining all this test information for the test equipment 210 for each new chip and for each new electronic assembly is a time-consuming and expensive undertaking. The preferred embodiments of the present invention described herein provide a control and monitor interface that allows testing to be performed at a higher level using existing network protocols.

Transmission Control Protocol/Internet Protocol

One known way to transmit information over a network uses the various communication protocols collectively referred to as TCP/IP, including the Transmission Control Protocol, the Internet Protocol, and Media Access Protocol (MAC). The Transmission Control Protocol dictates how information is assembled into packets of information that can be transmitted across a network. Internet Protocol dictates how those packets are routed. Media Access Protocol dictates the protocol for accessing the local communication media. TCP/IP is the primary network protocol used by web browsers to surf the world-wide web. Known browsers such as Netscape Navigator and Microsoft Internet Explorer support TCP/IP. For more information regarding TCP/IP, see Comer & Stevens, "Internetworking with TCP/IP: Design, Implementation and Internals", 3rd ed. (Prentice-Hall, June 1998).

Simple Network Management Protocol

Another known way to transmit information over a network uses a Simple Network Management Protocol (SNMP). SNMP is the standard operations and maintenance protocol for the Internet. SNMP is also the key technology that enabled the Internet's phenomenal growth. For information regarding SNMP, see the web site located at www.snmp.com.

DETAILED DESCRIPTION

According to preferred embodiments of the present invention, a chip under test includes a control and monitor interface that includes on-chip support for one or more network protocols that allow the chip to be directly coupled to a network. The control and monitor interface defines one or more operations that can be performed on the chip. In a system for testing chips under test, the control and monitor interface of all of the chips under test are coupled to a network, which is also coupled to a control and monitor mechanism. When a chip under test receives a message on the network to execute an operation, it performs the requested operation, then reports the results. In this manner much of the intelligence regarding the test can be pushed on-chip, rather than having all of the testing intelligence residing in an external tester. This allows some standardization in tests that are performed from one chip under test to the next.

Figure 4:
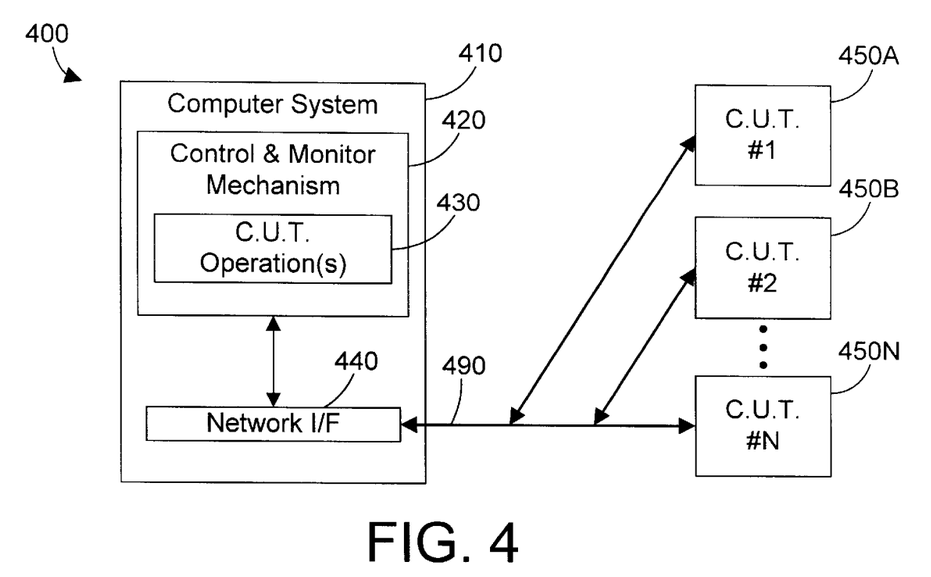
FIG. 4 is a block diagram of a system for controlling and monitoring one or more chips under test in accordance with the preferred embodiments.

Referring now to FIG. 4, an apparatus 400 for testing integrated circuits includes a computer system 410 coupled via a network 490 to one or more chips under test 450. Computer system 410 includes a control and monitor mechanism 420 that initiates defined operations 430 on the chips under test 450. Computer system 410 includes a network interface 440 that allows the control and monitor mechanism 420 to communicate over network 490 with the chips under test 450.

Figure 5:
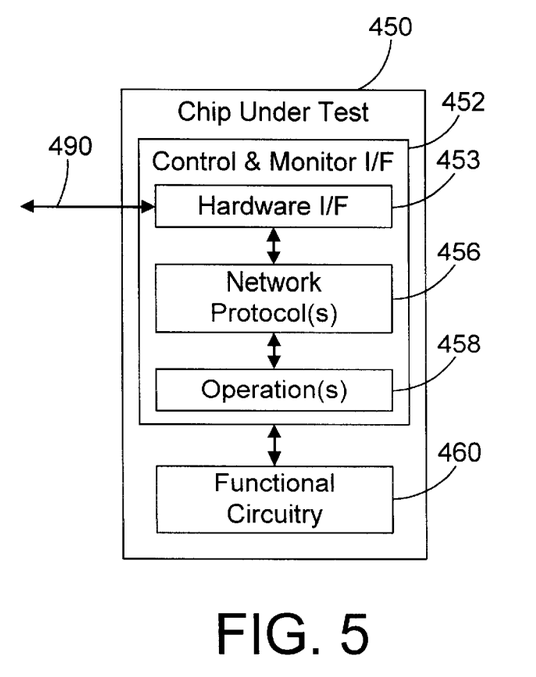
FIG. 5 is a block diagram of a chip under test shown in FIG. 4.

One suitable implementation for each chip under test 450 in FIG. 4 is shown in FIG. 5. Each chip under test 450 suitably includes functional circuitry 460 that performs the work for which the chip was designed. In addition, each chip under test 450 includes a control and monitor interface 452 that is used to communicate via a network 490 with a computer system, such as computer system 410 in FIG. 4. The control and monitor interface 452 suitably includes a hardware interface 453, as well as one or more network protocols 456 implemented on-chip to support communications over network 490. In addition, control and monitor interface 452 includes one or more defined operations 458. In the preferred embodiments, an operation 458 on the chip under test 450 is a high-level operation that puts much of the intelligence for testing the chip under test 450 on the chip itself. For example, an operation TEST_IO might be defined that causes the chip under test 450 to perform suitable tests on all its I/O pins and circuits, and report the results on the network 490. In similar fashion, any type of operation could be defined that causes the chip under test 450 to perform some type of predefined diagnostic or other operation on its functional circuitry 460. The term "operation" is used herein in a very broad sense to mean any type of diagnostic or test on the functional circuitry 460 or any other function on the functional circuitry 460. Note also that there may be some overlap between circuit elements in the functional circuitry 460 and circuit elements in the control and monitor interface 452.

Figure 6:
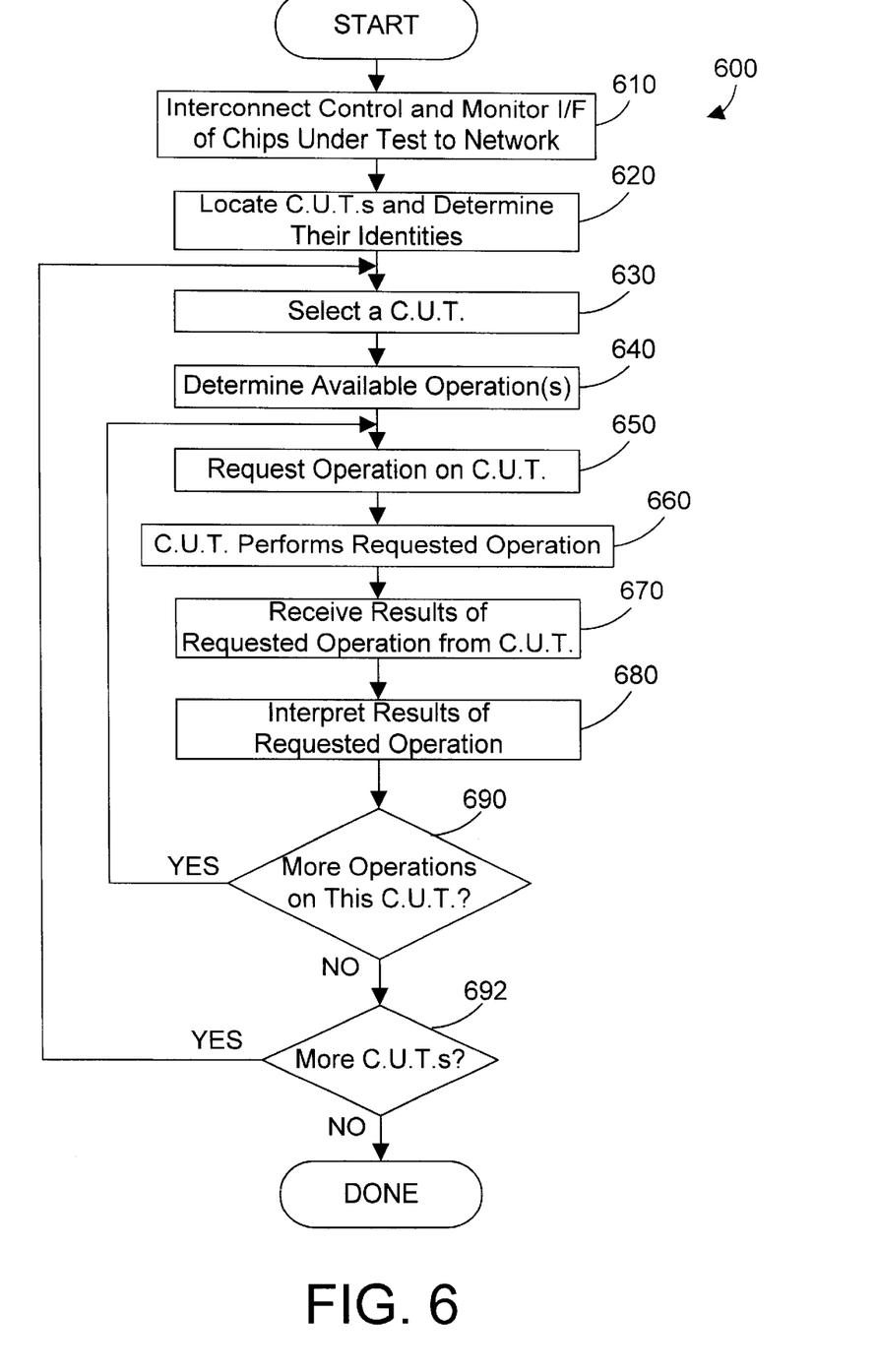
FIG. 6 is a flow diagram of a method for testing the chips under test in FIG. 4.

Referring to FIG. 6, a method 600 for testing the chips under test in FIG. 4 begins by interconnecting the control and monitor interfaces of all chips under test to a network (step 610), as shown in FIG. 4. Next, the chips under test are located and their identities are determined (step 620). One of the chips under test is then selected (step 630), and the operations available for that chip under test are then determined (step 640). Next, one of the available operations is requested on the selected chip under test (step 650). The selected chip under test then performs the requested operation (step 660), and returns the results of the requested operation (step 670). Finally, the results received in step 670 can be interpreted to determine whether the operation was successful or not (step 680). If there are more operations to perform on the selected chip under test (step 690=YES), steps 650, 660, 670, and 680 are repeated for each operation on the selected chip under test. If there are no more operations to perform on the selected chip under test (step 690=NO), method 600 then determines whether there are more chips under test that need to be tested (step 692). If so (step 692=YES), method 600 loops back, a new chip under test is selected (step 630), and the process continues until there are no more operations on the selected chip under test (step 690=NO) and there are no more chips under test to test (step 692=NO). At this point, method 600 is done.

Figure 7:
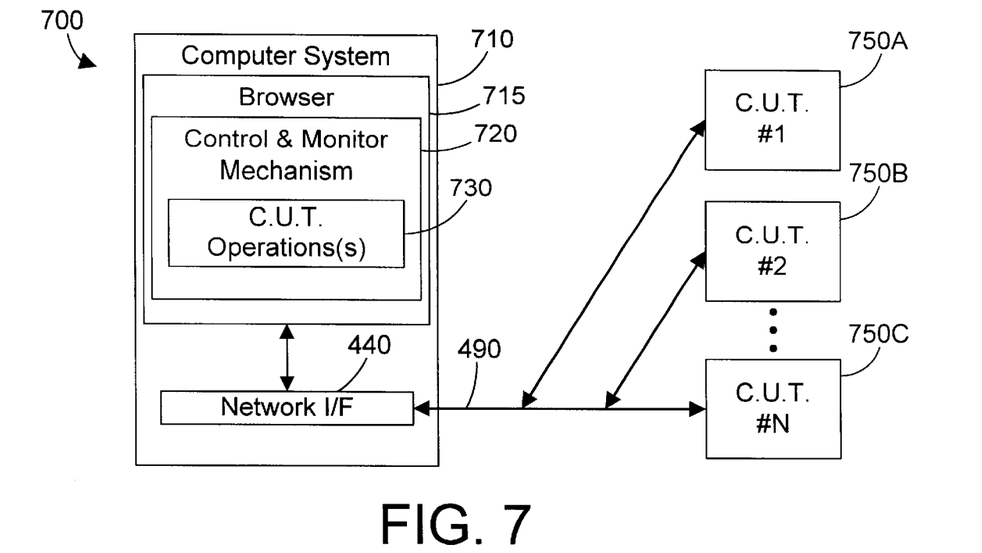
FIG. 7 is a block diagram of a system for controlling and monitoring one or more chips under test in accordance with a first implementation in accordance with the preferred embodiments.
Figure 8:
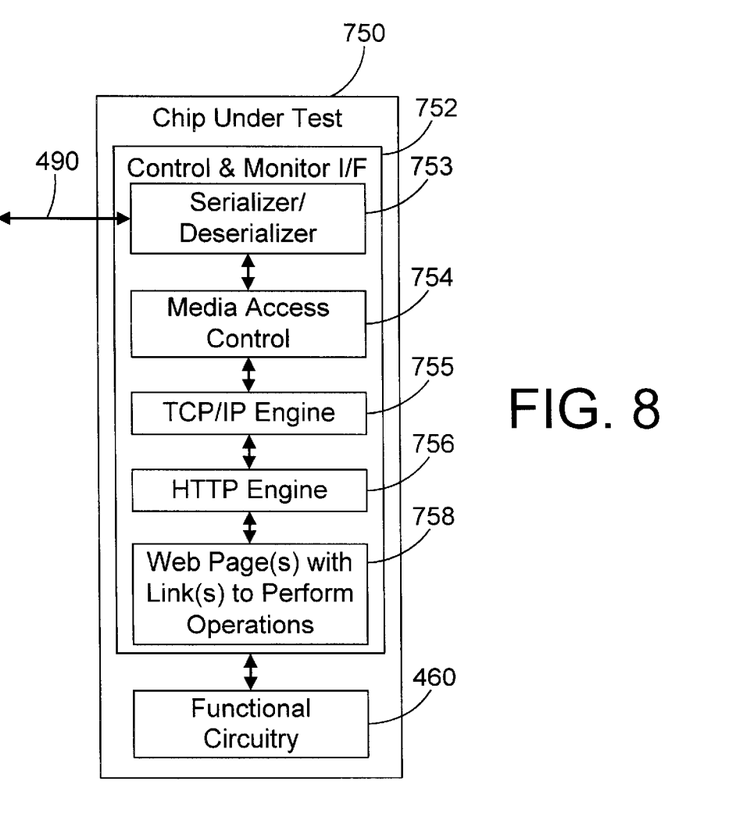
FIG. 8 is a block diagram of a chip under test shown in FIG. 7.
Figure 9:
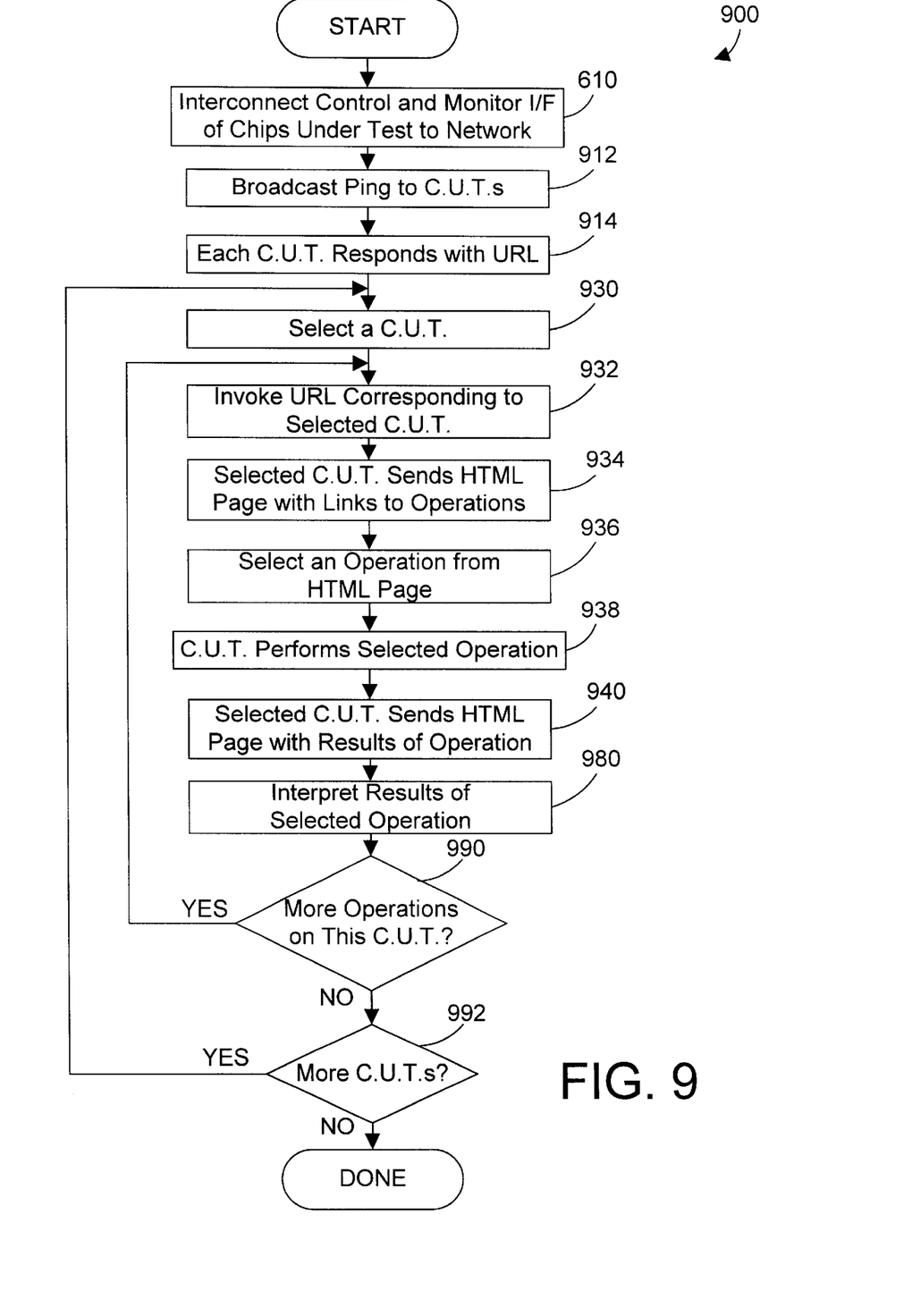
FIG. 9 is a flow diagram of a method for testing the chips under test in FIG. 7.

One specific implementation in accordance with the preferred embodiments is shown in FIGS. 7–9. Referring to FIG. 7, an apparatus 700 in accordance with this implementation includes a computer system 710 and a browser 715 that includes the control and monitor mechanism 720. One or more operations 730 are defined for one or more of the chips under test (step 730). The browser 715 is coupled to the network interface 440, which is coupled to the network 490. Each chip under test 750 is coupled to the network 490, similar to the configuration shown in FIG. 4.

Referring now to FIG. 8, a chip under test 750 as shown in FIG. 7 includes a control and monitor interface 752 and fictional circuitry 460. The control and monitor interface 752 for this specific implementation is designed to support Transmission Control Protocol/Internet Protocol (TCP/IP) and Hypertext Transfer Protocol (HTTP). The hardware interface is a serializer/deserializer 753. A media access control 754 mechanism is used to assemble the raw data received from the serializer/deserializer 753 into frames. The TCP/IP engine 755 is on-chip support for the TCP/IP protocol. The HTTP engine 756 is on-chip support for hypertext transfer protocol (HTTP). Both the TCP/IP engine 755 and the HTTP engine 756 provide the on-chip support for one or more network protocols. Finally, the control and monitor interface 752 includes one or more web pages 758 defined in hypertext. These hypertext pages 758 suitably include one or more links to performing operations on the chip under test 750. The function of the chip under test 750 and the computer system 710 of FIG. 7 are best understood with reference to the flow diagram of FIG. 9.

Referring now to FIG. 9, a method 900 represents the steps that are suitably carried out for the apparatus of FIG. 7. First, the control and monitor interfaces of all the chips under test are interconnected to a network (step 610) that is the same network 490 connected to the computer system 710 (see FIG. 7). Next, the computer system 710 broadcasts over network 460 a ping (step 912), which is a common network function that causes all devices on the network to respond with a unique identifier, in this particular case a uniform resource locator (URL) for each chip under test (step 914). A chip under test is then selected (step 930), and the URL corresponding to that chip under test is invoked (step 932). The URL for a chip under test essentially accesses the chip's "home page", which will typically include one or more links to other pages 758. The home page of the chip under test is then sent to the computer system (step 934) and displayed to a user. The user can then select an operation on the chip under test (step 936) by clicking on a hot link in the displayed HTML page corresponding to the selected operation. The chip under test then performs the selected operation (step 938), and sends to the computer system 710 another HTML page indicating the results of the requested operation (step 940) and the expected results. The results are then interpreted (step 980). One way to interpret the results is for a user to manually interpret the results by visually looking at the results HTML page an comparing the actual results to the expected results. In the alternative, computer system 710 can automatically compare the results in the HTML page to the expected results in the HTML page, and can then take appropriate action, such as indicating a failure to a user. If there are more operations to perform on this selected chip under test (step 990=YES), method 900 loops back to step 932 and continues. If no more operations need to be performed on the selected chip under test (step 990=NO), method 900 determines if there are more chips under test that need to be tested (step 992). If so (step 992=YES), method 900 loops back to step 930 and continues. If not (step 992=NO), method 900 is done.

One primary advantage for the implementation of FIGS. 7–9 is that each chip under test 750 is self-describing, which means that computer system 710 does not need to know any information whatsoever regarding the chips under test 750 in the system. In other words, the defined operations 1030 on each chip under test are not present in computer system 710 until the browser 715 accesses the URL for a chip under test 750 to determine which operations are available. Computer system 710 only needs a web browser 715 to allow a user to communicate with the chips under test. After determining the URLs for each of the chips under test in response to the ping in step 912, the browser can access a URL for a selected chip under test, which then displays an HTML page that contains one or more of the available operations 730. A user selects an operation by preferably clicking on a hot link in the HTML page, which causes the chip under test to perform the operation. We thus see several distinct advantages with the specific implementation of FIGS. 7–9. First, the operations on the chip under test are completely self-contained within the chip under test as part of the chip design. Second, the available operations are determined by simply displaying an HTML page by accessing the URL corresponding to the chip under test. Thus, no intelligence regarding the available operations or expected results are required in computer system 710. Third, a common browser can be used to communicate with the chips under test. This eliminates the need for special and proprietary hardware and software to perform testing of integrated circuits. This combination of features allows a user to communicate with chips under test using a standard browser and existing network communication techniques.

Another advantage of the implementations of FIGS. 7–9 is that computer system 710 may access needed information directly from the world-wide web. For example, a home page for a chip under test may include a "Help" link that, when checked, displays help pages on the world-wide web that provide help in testing that particular chip under test. In addition, a chip manufacturer may monitor which help pages are most frequently accessed to determine how to best improve the testability of a particular chip or chip family. Furthermore, the chip under test could access a URL on the world-wide web to log that it has been tested. This feature would allow manufacturers to collect and track test data to help improve manufacturing processes and to know the number and type of chips being tested.

Figure 10:
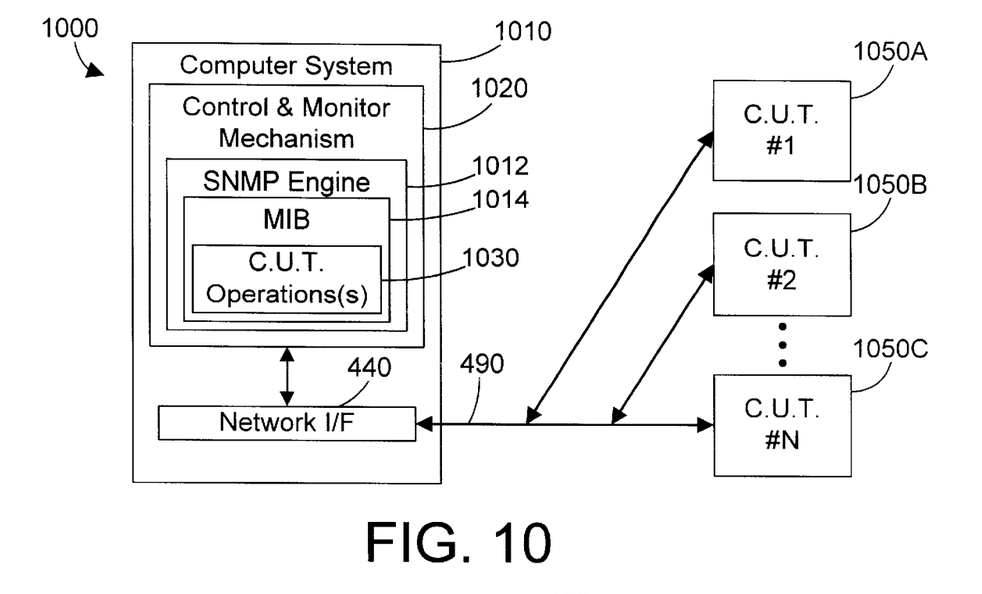
FIG. 10 is a block diagram of a system for controlling and monitoring one or more chips under test in accordance with a second implementation in accordance with the preferred embodiments.
Figure 11:
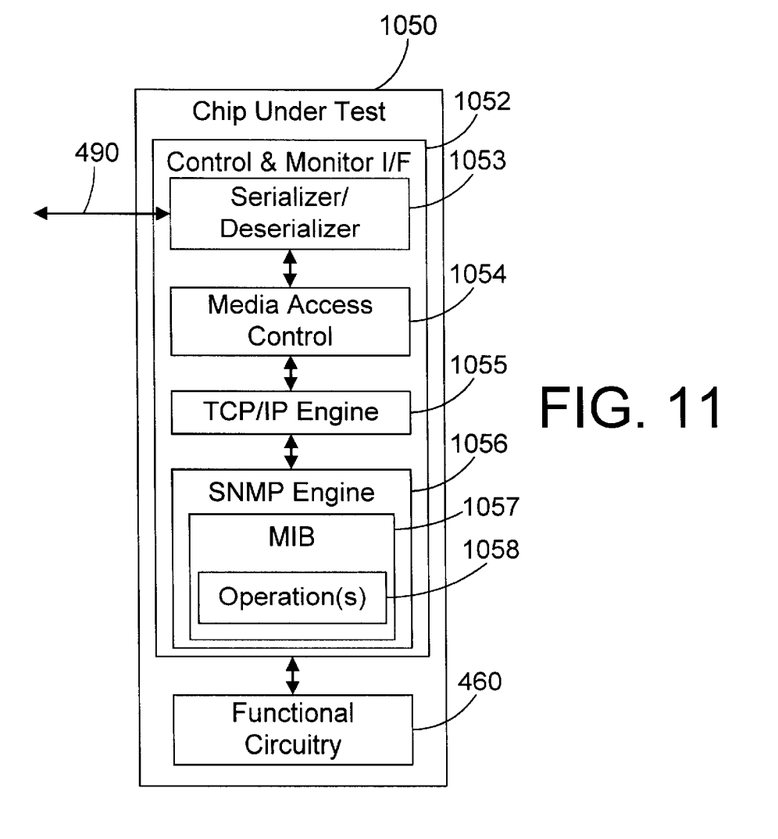
FIG. 11 is a block diagram of a chip under test shown in FIG. 10.
Figure 12:
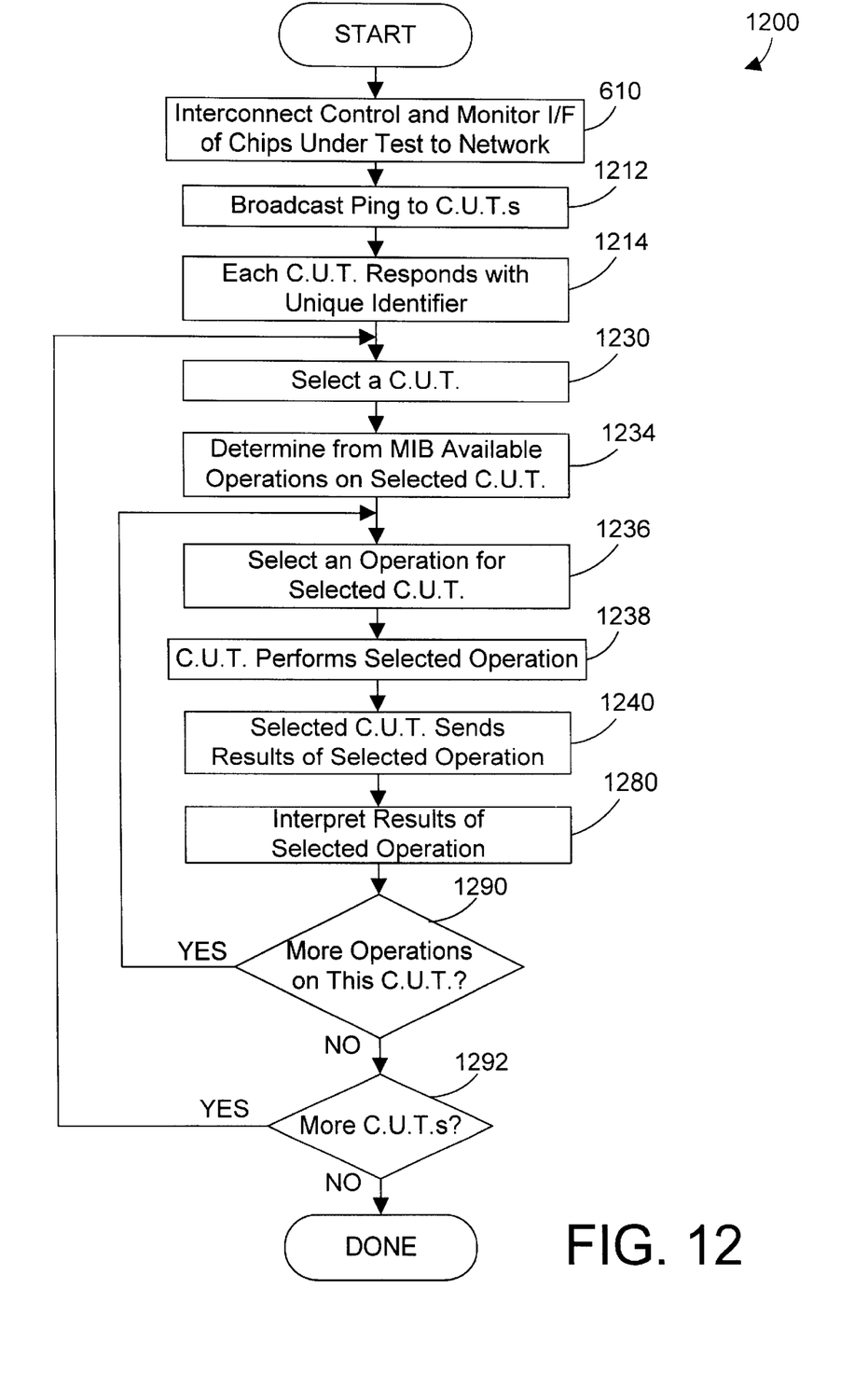
FIG. 12 is a flow diagram of a method for testing the chips under test in FIG. 10.

Another specific implementation in accordance with the preferred embodiments is shown in FIGS. 10–12. While the implementation in FIGS. 7–9 uses HTTP to communicate between computer system 710 and chips under test 750 using hypertext pages, the implementation in FIGS. 10–12 use a Small Network Management Protocol (SNMP) instead of HTTP. Referring to FIG. 10, computer system 1010 includes a control and monitor mechanism 1020 that communicates with an SNMP engine 1012 that supports communication over network 490 via SNMP. SNMP engine 1012 includes a management information base (MIB) that is a tree structure that describes the network configuration and available operations 1030 of the chips under test.

FIG. 11 illustrates one suitable implementation for the chips under test 1050 in FIG. 10. Chip under test 1050 includes a control and monitor interface 1052 and functional circuitry 460. Control and monitor interface 1052 includes a serializer/deserializer 1053, a media access control 1054, and a TCP/IP engine 1055, which are similar to these respective elements 753, 754 and 755 as described above in connection with FIG. 7. Control and monitor interface 1052 further includes an SNMP engine 1056, which contains a MIB 1057 that defines one or more operations 1058 on the chip under test 1050. In the preferred embodiments, MIB 1057 and operations 1058 are the same as MIB 1014 and operations 1030 in FIG. 10. The operation of the implementation of FIGS. 10 and 11 is best understood with respect to the flow diagram of FIG. 12.

Referring now to FIG. 12, a method 1200 for testing one or more chips under test as shown in FIGS. 10 and 11 begins by interconnecting the control and monitor interface of the chips under test to a network (step 610). Next, the computer system 1010 broadcasts a reverse address resolution protocol (RARP) to the chips under test (step 1212). The RARP is a known way to determine who is connected to a network. For details regarding RARP, see http://metalab.unc.edu/mdw/LDP/nag/node26.html, or see the Comer & Stevens book referenced above that described TCP/IP. In response, each chip under test responds with a unique identifier (step 1214). A chip under test is then selected (step 1230). The control and monitor mechanism 1020 then determines from the MIB 1014 the available operations for the selected chip under test (step 1234). One of these available operations is then selected (step 1236), and the computer system 1010 then transmits a message to the selected chip under test (using SNMP) to perform the selected operation. In response, the selected chip under test performs the selected operation (step 1238). The selected chip under test then transmits the results of the selected operation to the computer system 1010 (step 1240). Computer system 1010 then interprets the results (step 1280). If there are more operations on the selected chip under test that need to be performed (step 1290=YES), method 1200 loops back to step 1236 and continues with the next operation. If there are no more operations on the selected chip under test (step 1290=NO), method 1200 then determines if there are other chips under test that need to be tested (step 1292). If so (step 1292=YES), method 1200 then loops back to step 1230 and continues. If not (step 1292=NO), method 1200 is done.

One difference between the implementation in FIGS. 7–9 and the implementation in FIGS. 10–12 is that the computer system 710 in FIG. 7 does not have any information relating to the available operations on the chips under test, while the computer system 1010 in FIG. 10 has a MIB 1014 that describes the chips under test in the system and their available operations, and each chip under test has a corresponding MIB 1057. Thus, the implementation in FIGS. 10–12 requires some information in the computer system 1010 relating to the available operations, rather than dynamically determining from the chips under test the available operations as shown in FIGS. 7–9.

Note that the description above for the implementations of FIGS. 7–12 assumes that each individual chip under test has a unique identifier that identifies the chip on the network. However, other variations are also within the scope of the preferred embodiments. For example, instead of directly coupling the chips under test to a network that is directly coupled to the computer system (as shown in FIGS. 7 and 10), the computer system could instead communicate with a proxy that is in turn coupled to the chips under test. In this configuration, the proxy could assign unique identifiers for all chips under test, and present a view to the computer system that appears that each chip under test has a unique identifier, even though the proxy is responsible for generating the unique identifiers and for routing network messages to the appropriate chips under test. Of course, various other network configurations are possible within the scope of the preferred embodiments.

While the description above and FIGS. 8 and 11 show the implementation of a single network protocol in each chip under test, FIG. 5 makes it clear from network protocol(s) 456 that multiple network protocols may be implemented in a chip under test. Providing on-chip support for multiple network protocols allows chip under test 450 to be tested using different network protocols and associated techniques.

Figure 13:
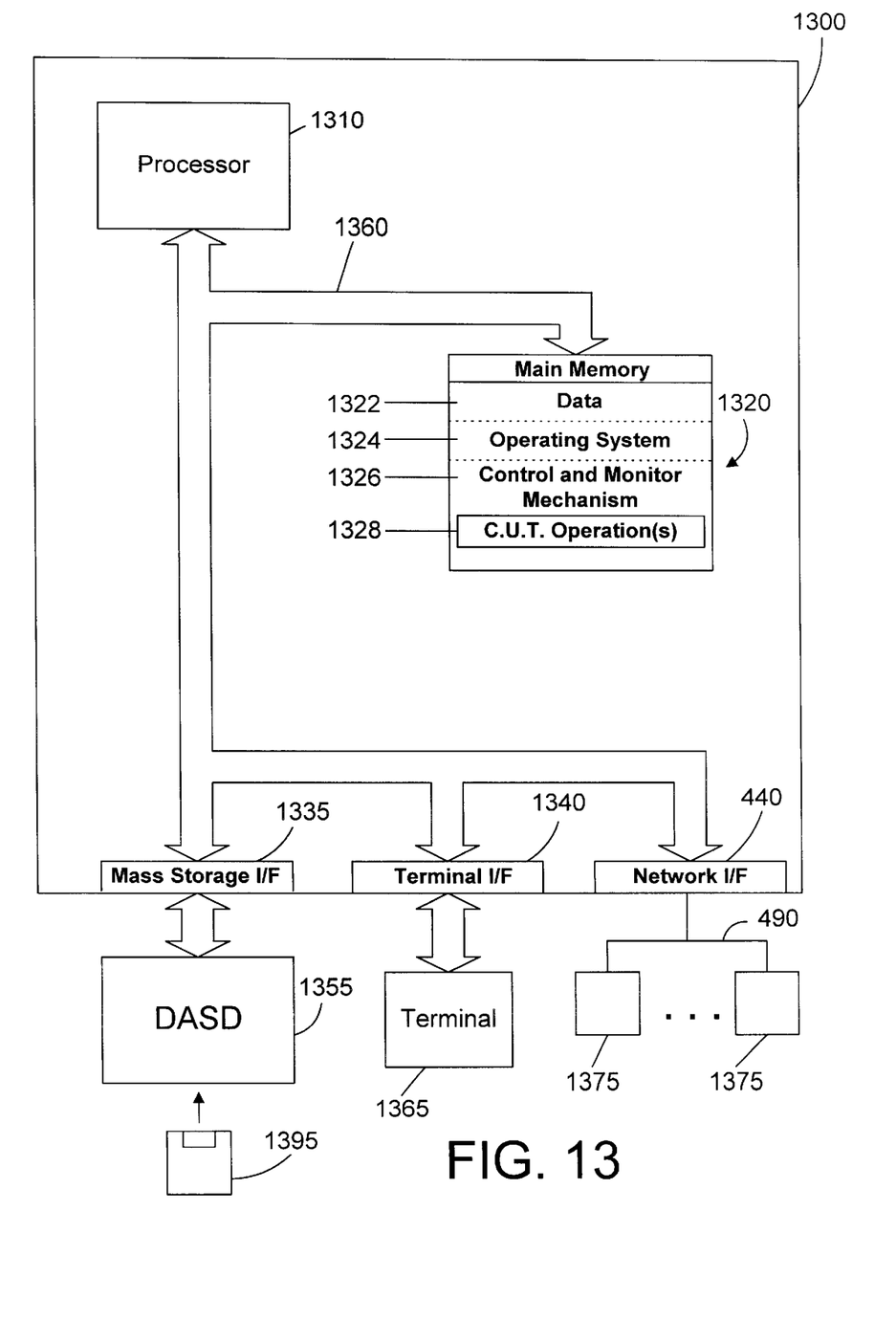
FIG. 13 is a block diagram of a suitable computer system that may be used for testing chips under test in accordance with the preferred embodiments.

Referring to FIG. 13, a computer system 1300 is representative of a suitable implementation for computer system 410 in FIG. 4, computer system 710 in FIG. 7, and computer system 1010 in FIG. 10. Computer system 1300 is an enhanced IBM AS/400 computer system. However, those skilled in the art will appreciate that the mechanisms and apparatus of the present invention apply equally to any computer system, regardless of whether the computer system is a complicated multi-user computing apparatus, a single user workstation, or an embedded control system. As shown in FIG. 13, computer system 1300 comprises a processor 1310 connected to a main memory 1320, a mass storage interface 1335, a terminal interface 1340, and a network interface 440. These system components are interconnected through the use of a system bus 1360. Mass storage interface 1335 is used to connect mass storage devices (such as a direct access storage device 1355) to computer system 1300. One specific type of direct access storage device is a floppy disk drive, which may store data to and read data from a floppy diskette 1395.

Main memory 1320 contains data 1322, an operating system 1324, and control and monitor mechanism 1326. Control and monitor mechanism 1326 includes one or more operations 1328 for one or more chips under test. Computer system 1300 utilizes well known virtual addressing mechanisms that allow the programs of computer system 1300 to behave as if they only have access to a large, single storage entity instead of access to multiple, smaller storage entities such as main memory 1320 and DASD device 1355. Therefore, while data 1322, operating system 1324, and control and monitor mechanism 1326 are shown to reside in main memory 1320, those skilled in the art will recognize that these programs are not necessarily all completely contained in main memory 1320 at the same time. It should also be noted that the term "memory" is used herein to generically refer to the entire virtual memory of computer system 1300.

Processor 1310 may be constructed from one or more microprocessors and/or integrated circuits. Processor 1310 executes program instructions stored in main memory 1320. Main memory 1320 stores programs and data that processor 1310 may access. When computer system 1300 starts up, processor 1310 initially executes the program instructions that make up operating system 1324. Operating system 1324 is a sophisticated program that manages the resources of computer system 1300. Some of these resources are processor 1310, main memory 1320, mass storage interface 1335, terminal interface 1340, network interface 440, and system bus 1360.

Data 1322 represents any data that serves .as input to or.output from any program in computer system 1300.

Operating system 1324 is a multitasking operating system known in the industry as OS/400; however, those skilled in the art will appreciate that the spirit and scope of the present invention is not limited to any one operating system.

Control and monitor mechanism 1326 is any suitable implementation of a control and monitor mechanism within the scope of the preferred embodiments. For example, control and monitor mechanism 1326 may correspond to the control and monitor mechanism 420 of FIG. 4, control and monitor mechanism 720 of FIG. 7, control and monitor mechanism 1020 of FIG. 10, or any other suitable implementation of a control and monitor mechanism. Various implementations of the control and monitor mechanism are described in detail above as examples that are within the scope of the preferred embodiments.

Although computer system 1300 is shown to contain only a single processor and a single system bus, those skilled in the art will appreciate that the present invention may be practiced using a computer system that has multiple processors and/or multiple buses. In addition, the interfaces (called input/output processors in AS/400 terminology) that are used in the preferred embodiment each include separate, fully programmed microprocessors that are used to off-load compute-intensive processing from processor 110. However, those skilled in the art will appreciate that the present invention applies equally to computer systems that simply use I/O adapters to perform similar functions.

Terminal interface 1340 is used to directly connect one or more terminals 1365 to computer system 1300. These terminals 1365, which may be non-intelligent (i.e., dumb) terminals or fully programmable workstations, are used to allow system administrators and users to communicate with computer system 100. Note, however, that while terminal interface 1340 is provided to support communication with one or more terminals 1365, computer system 1300 does not necessarily require a terminal 1365, because all needed interaction with users and other processes may occur via network interface 440.

Network interface 440 is used to connect other computer systems and/or workstations and chips under test (e.g., 1375 in FIG. 13) to computer system 1300 across a network 490. The present invention applies equally no matter how computer system 1300 may be connected to other computer systems and/or workstations, regardless of whether the network connection 490 is made using present-day analog and/or digital techniques or via some networking mechanism of the future. In addition, many different network protocols can be used to implement a network. These protocols are specialized computer programs that allow computers to communicate across network 490. TCP/IP (Transmission Control Protocol/Internet Protocol) is an example of a suitable network protocol.

By defining operations on each chip that test or exercise the functional circuitry on the chip, a set of standard operations can be defined for different chips. For example, as referenced above, a standard operation TEST_IO could be defined for each chip that performs functional testing of all I/O pins and their supporting circuitry. Many other standard operations could be defined that perform similar functions across multiple chips under test. These standardized tests could be especially useful in describing tests that are common to chips in a family. For example, chips that are microprocessors may include a set of common functions that test the ALU, cache, addressing, I/O, registers, etc. By defining a common set of tests for each family of chips, testing of these common functions can become highly automated by invoking these operations for each chip under test that is a member of that family.

The preferred embodiments described herein disclose a way for a computer system to communicate directly with chips under test by incorporating a network interface including one or more suitable network protocols on-chip for each chip under test. Intelligence for testing functional circuitry on each chip under test is embedded in the chip itself, and may be invoked by sending one or more messages to a chip under test. Known tools such as browsers and SNMP network tools that run on computer workstations can be used to perform testing and control of the chips under test, rather than having dedicated specialized test equipment. The preferred embodiments thus provide a substantial improvement over the prior art by making chips testable using existing network tools without a great deal of intelligence regarding the chips under test in the computer system that performs the testing of the chips under test.

One skilled in the art will appreciate that many variations are possible within the scope of the present invention. Thus, while the invention has been particularly shown and described with reference to preferred embodiments thereof, it will be understood by those skilled in the art that these and other changes in form and details may be made therein without departing from the spirit and scope of the invention.

We claim:

1. An apparatus for testing integrated circuits comprising:
   a computer system that includes a control and monitor mechanism and a network interface;
   at least one chip under test that includes a control and monitor interface coupled via a network to the network interface in the computer system, the control and monitor interface providing on-chip hardware support for communicating over the network, each chip under test defining at least one operation that tests at least one function in the chip under test, wherein each operation may be requested by the computer system transmitting a message to the chip under test via the network.

2. The apparatus of claim 1 wherein the on-chip hardware support for communicating over the network comprises circuitry that implements Transmission Control Protocol/Internet Protocol (TCP/IP).

3. The apparatus of claim 2 wherein the on-chip hardware support for communicating over the network further comprises circuitry that implements Small Network Management Protocol (SNMP).

4. The apparatus of claim 2 wherein the on-chip hardware support for communicating over the network further comprises circuitry that implements Hypertext Transfer Protocol (HTTP).

5. The apparatus of claim 1 wherein the on-chip hardware support for communicating over the network comprises circuitry that implements a plurality of network communication protocols.

6. The apparatus of claim 1 wherein at least one chip under test further defines at least one operation that causes the chip under test to perform at least one predetermined function.

7. An integrated circuit comprising:
   functional circuitry;
   a control and monitor interface that includes a hardware serial interface and on-chip support for at least one network protocol in the integrated circuit; and
   at least one operation defined in the integrated circuit that tests at least a portion of the functional circuitry when the at least one operation is requested via the control and monitor interface.

8. The integrated circuit of claim 7 wherein the at least one network protocol comprises Transmission Control Protocol/Internet Protocol (TCP/IP).

9. The integrated circuit of claim 8 wherein the at least one network protocol further comprises Small Network Management Protocol (SNMP).

10. The integrated circuit of claim 8 wherein the at least one network protocol further comprises Hypertext Transfer Protocol (HTTP).

11. The integrated circuit of claim 7 further comprising at least one operation defined in the integrated circuit that causes the functional circuitry to perform at least one predetermined function.

12. A method for testing integrated circuits, the method comprising the steps of:
   (A) coupling a control and monitor mechanism in a computer system to a control and monitor interface in at least one chip under test;
   (B) determining which tests may be performed on the at least one chip under test;
   (C) the computer system requesting that a selected one of the tests be performed on a selected chip under test by the control and monitor mechanism sending a message to the control and monitor interface on the selected chip under test;
   (D) the selected chip under test performing the selected test in response to receiving the message from the computer system;
   (E) the selected chip under test returning results of the selected test to the computer system.

13. The method of claim 12 wherein step (B) comprises the step of querying the chip under test for the tests that may be performed on the at least one chip under test.

14. The method of claim 13 wherein the step of querying the chip under test comprises the step of sending a uniform resource locator (URL) to the chip under test that causes the chip under test to display a hypertext page that includes the tests that may be performed on the at least one chip under test.

15. The method of claim 12 further comprising the step of invoking at least one uniform resource locator (URL) on the world-wide web.

16. The method of claim 12 wherein step (B) comprises the step of querying a database for the tests that may be performed on the at least one chip under test.

17. The method of claim 16 wherein the step of querying the database comprises the step of querying a Management Information Base (MIB) that describes the network configuration in a network that supports Small Network Management Protocol (SNMP).

18. The method of claim 12 wherein step (A) comprises the steps of coupling the control and monitor mechanism in the computer system to a network and coupling the control and monitor interface of each chip under test to the network.

19. A method for performing a plurality of operations on at least one chip under test, wherein each chip under test includes a control and monitor interface with on-chip support for at least one network protocol, the method comprising the steps of:
   coupling the control and monitor interface on each chip under test to a network;
   determining the plurality of operations that may be performed on the at least one chip under test;
   requesting that a selected one of the plurality of operations be performed on a selected chip under test by sending a message to the selected chip under test via the network;

the selected chip under test performing the selected operation; and the selected chip under test transmitting results of the selected operation via the network.

20. A method for performing a plurality of operations on at least one chip under test, wherein each chip under test includes a control and monitor interface with on-chip support for at least one network protocol, the method comprising the steps of:

(A) coupling the control and monitor interface on each chip under test to a network;

(B) broadcasting a ping on the network to determine the identities of the chips under test on the network;

(C) each chip under test responding to the ping with a uniform resource locator (URL);

(D) selecting a chip under test;

(E) invoking the URL corresponding to the selected chip under test;

(F) displaying a hypertext page received from the chip under test, the hypertext page including a plurality of operations that may be performed on the selected chip under test;

(G) selecting one of the plurality of operations from the displayed hypertext page;

(H) the selected chip under test performing the selected operation;

(I) displaying a hypertext page received from the chip under test that includes results of the selected operation;

(J) if there are more operations to perform on the selected chip under test, repeating steps (E) through (I); and (K) if there are more chips under test to be tested, repeating steps (D) through (J).

21. The method of claim 20 further comprising the step of invoking at least one uniform resource locator (URL) on the world-wide web.

22. A method for performing a plurality of operations on at least one chip under test, wherein each chip under test includes a control and monitor interface with on-chip support for at least one network protocol, the method comprising the steps of:

(A) coupling the control and monitor interface on each chip under test to a network;

(B) broadcasting a ping on the network to identify the chips under test on the network;

(C) each chip under test responding to the ping with a unique identifier;

(D) selecting a chip under test;

(E) determining from a database the available operations for the selected chip under test;

(F) selecting one of the available operations for the selected chip under test;

(G) the selected chip under test performing the selected operation;

(H) receiving from the chip under test results of the selected operation;

(I) if there are more operations to perform on the selected chip under test, repeating steps (E) through (H); and (J) if there are more chips under test to be tested, repeating steps (D) through (I).

* * * * *